United States Patent [19]

Maeda et al.

[11] Patent Number: 5,243,557
[45] Date of Patent: Sep. 7, 1993

[54] BI-CMOS SEMICONDUCTOR INTEGRATED CIRCUIT

[75] Inventors: Takeo Maeda, Tokyo; Yukari Unno, Yokohama; Hiroshi Momose, Tokyo; Masataka Matsui, Yokohama, all of Japan

[73] Assignee: Kabushiki Kaisha Toshiba, Kawasaki, Japan

[21] Appl. No.: 985,109

[22] Filed: Dec. 3, 1992

[30] Foreign Application Priority Data

Dec. 4, 1991 [JP] Japan ................................. 3-320377
Oct. 1, 1992 [JP] Japan ................................. 4-263782

[51] Int. Cl.$^5$ ............................................. G11C 11/40
[52] U.S. Cl. .................................... 365/177; 365/174; 365/230.06
[58] Field of Search .................. 365/174, 182, 189.01, 365/189.03, 189.04, 230.01, 230.06, 177

[56] References Cited

U.S. PATENT DOCUMENTS

5,136,535 8/1992 Scharrer et al. .................. 365/177

Primary Examiner—Terrell W. Fears
Attorney, Agent, or Firm—Finnegan, Henderson, Farabow, Garrett & Dunner

[57] ABSTRACT

Disclosed here in is a semiconductor integrated circuit comprising a substrate, a memory cell array having a plurality of memory cells arranged in rows and columns, a plurality of word lines, and a plurality of bit lines, and a plurality of word-line drive circuits located near the memory cell array. Each of the word-line drive circuits is a Bi-NMOS circuit which comprises a bipolar transistor for pulling up the potential of the word line and an N-channel MOS transistor for pulling down the potential of the word line. The collector layers of the bipolar transistors are formed of one and the same layer.

12 Claims, 6 Drawing Sheets

BI-CMOS SEMICONDUCTOR INTEGRATED CIRCUIT

BACKGROUND OF THE INVENTION

1. Field of the Invention

The present invention relates to a Bi-CMOS semiconductor integrated circuit (IC) comprising bipolar (Bi) elements and complementary metal oxide semi-conductor (CMOS) elements, and more particularly to word-line drive circuits for driving the word lines of the memory cell array incorporated in a Bi-CMOS IC.

2. Description of the Related Art

A Bi-CMOS memory LSI, such as a SRAM (Static Random-Access Memory), comprises a memory cell array and a plurality of Bi-CMOS word-line drive circuits. The Bi-CMOS word-line drive circuits are arranged near the memory cell array and used to drive the word lines of the memory cell array at high speed.

Figure 1:
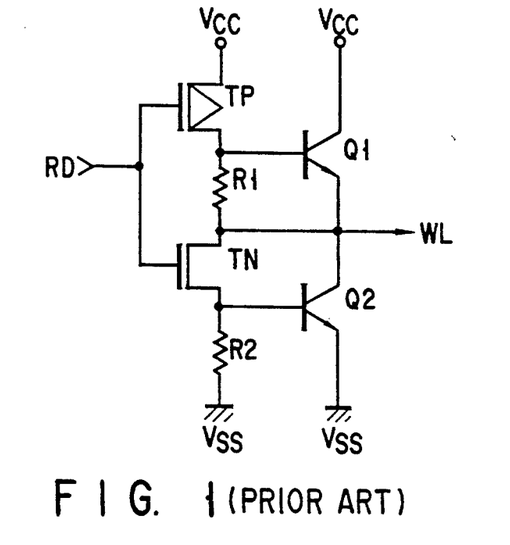
FIG. 1 is a diagram showing a conventional Bi-CMOS word-line drive circuit.

FIG. 1 shows that one of the identical Bi-CMOS word-line drive circuits, designed to drive one of the word lines of the SRAM. The word-line drive unit comprises an NPN transistor Q1 for pulling up the word-line potential, an NPN transistor Q2 for pulling down the word-line potential, a P-channel MOS transistor TP for driving the pull-up NPN transistor Q1, an N-channel MOS transistor TN for driving the pull-down NPN transistor Q2, and two resistors R1 and R2. In FIG. 1, Vcc indicates the power-supply potential, Vss designates the ground potential, WL is one of the word lines of the memory cell array, and RD denotes a word-line selecting signal (i.e., a signal output by a decoder).

The conventional Bi-CMOS word-line drive circuit has bipolar transistors which are arranged at the rate of ½ piece per cell pitch of the memory cell array.

Figure 2:
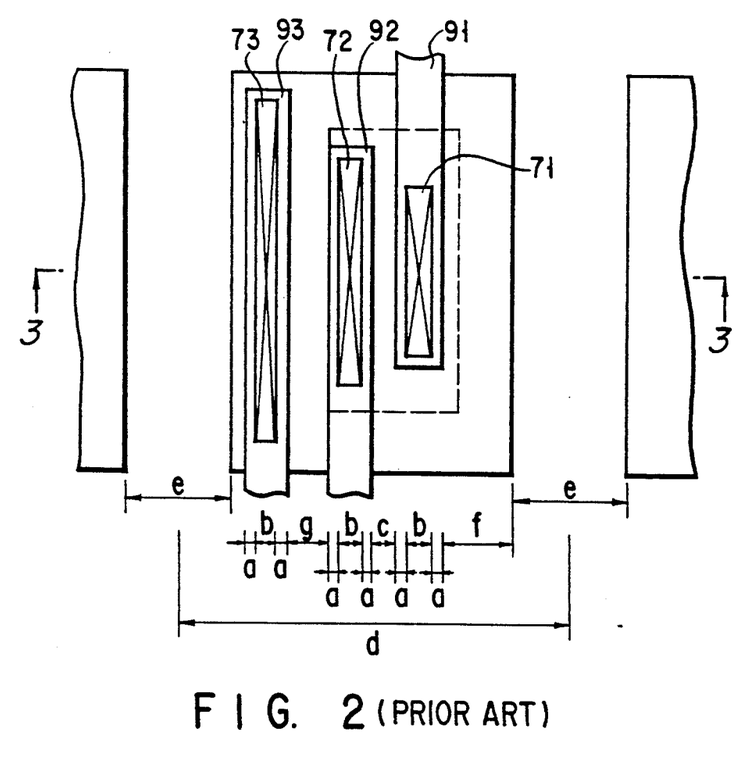
FIG. 2 is a plan view of the Bi-CMOS word-line drive circuit shown in FIG. 1.

FIG. 2 is a plan view showing a part of an IC chip having a plurality of Bi-CMOS word-line drive circuits identical to that one shown in FIG. 1. More precisely, FIG. 2 shows that region in which one of the word-line drive circuits is formed and which includes the NPN transistor Q1 for pulling up the word-line potential.

Figure 3:
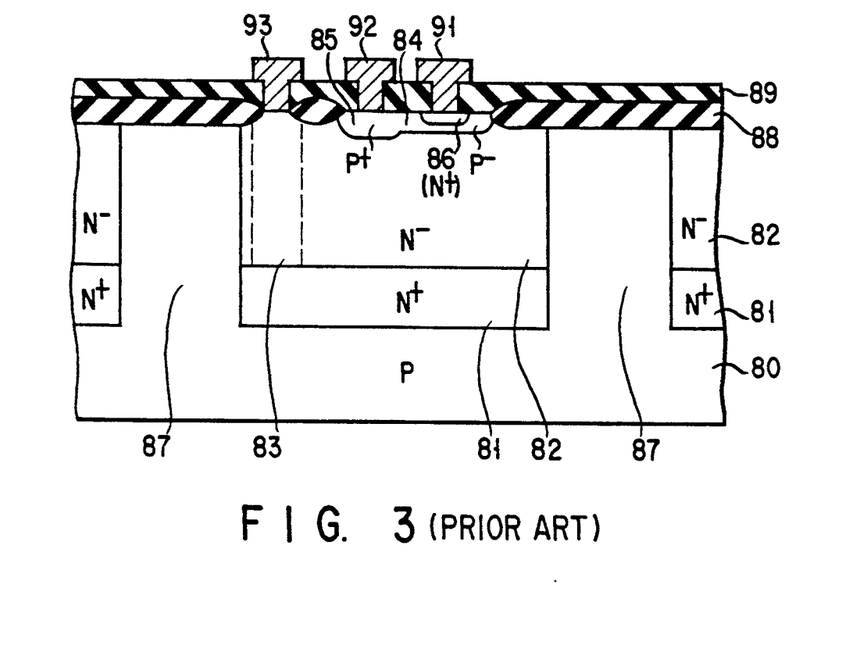
FIG. 3 is a cross-sectional view, taken along line 3—3 in FIG. 2.

FIG. 3 is a cross-sectional view taken along line 3—3 in FIG. 2. As can be understood from FIG. 3, said part of the IC chip comprises a semiconductor substrate 80 (a P-type silicon substrate), an N+ type buried layer 81 formed within the substrate 80, an N− type collector region 82 (an epitaxial layer) formed in the substrate 80 and on the buried layer 81, and a collector lead region 83 formed integral with the collector region 82 and connected to the buried layer 81.

The part of the IC chip further comprises a P− type intrinsic base region 84 (inner base region) formed in the surface of a portion of the collector region 82, a P+ type outer base region 85 formed in the surface of a portion of the collector region 82, an N+ emitter region 86 formed in the surface of a portion of the inner base region 84, an element-isolating region 87 formed in the substrate 80 and isolating two bipolar transistors formed in the substrate 80, from each other, a field oxide film 88 formed in the surface of a portion of the substrate 80 and isolating the bipolar transistors, and an inter-layer insulating film 89 covering the surface of the entire substrate 80.

As is shown in FIG. 3, the inter-layer insulating film 89 has contact holes. An emitter line 91 made of metal extends through the first contact hole, contacting the emitter region 86 at one end and connected to a word line at the other end. A base line 92 made of metal extends through the second contact holes, contacting the outer base region 85. A collector line 93 made of metal extends through the third contact hole, contacting the collector lead region 83.

As is shown in FIG. 2, the emitter line 91 has a contact portion 71, the base line 92 has a contact portion 72, and the collector line 93 has a contact portion 73. In FIG. 2, a is the difference between half the width of each metal line and half the width of the contact hole, b is the width of each contact hole, c is the distance between the emitter line 91 and the base line 92, d is the width of the bipolar transistor Q1, e is the distance between the bipolar transistor Q1 and either adjacent bipolar transistor, f is the distance between the inner base region 84 and the element-isolating region 87, and g is the distance between the outer base region 85 and the collector line 93.

The width d of the bipolar transistor Q1 is determined by four factors—(i) the sum of the differences a, the width b of contact holes, the distance c between the liens 91 and 92, (ii) and the distance f between the regions 84 and 87 (i.e., microprocessing dimensions), (iii) the distance e between the bipolar transistor Q1 and either adjacent bipolar transistor, and (iv) the distance g between the outer base region 85 and the collector line 93.

In order to increase the storage capacity of the SRAM, the microprocessing dimensions are reduced, thereby reducing the size of the memory cells and the memory-cell pitch. Hence, the bipolar transistors of the word-line drive circuit must be arranged, at the rate of one or ½ piece per cell pitch. To this end it is necessary to decrease the width d of the bipolar transistor Q1. However, the width d can hardly be reduced, however. This is because the bipolar transistor Q1 has the element-isolating region 87, making it difficult to decrease the width d to the size of the memory cell.

In the case of 0.5 μm design rule, for example, a=0.2 μm, b=0.5 μm, c=0.5 μm, e=3.0 μm, f=2.0 μm, and g=1.0 μm. The smallest value possible for the width d of the transistor Q1 is 9.2 μm, that is, d=6a+3b+c+g+f+e=9.2 μm.

The distance f is the width of an N-type isolating region located between the P-type regions 84 and 87, and the distance e is the width of the P-type isolating region 87 located between N-type regions. The N-type isolating region and the P-type isolating region 87 can have their widths f and e reduced by increasing their impurity concentrations. If their impurity concentrations are increased, however, the base-collector capacitance or collector-substrate capacitor of the bipolar transistor Q1 will increase, inevitably degrading the characteristic of the transistor Q1.

Even if the design rule is changed to one less than 0.5 μm, e, f, and g remain unchanged. Hence, d cannot decrease below 6 μm. Since the memory cells incorporated in a 4-MB SRAM has a length of about 5 μm, it is next to possible to arrange bipolar transistors in the word-line drive circuit, each for every two memory cells —that is, at the rate of ½ piece per cell pitch.

SUMMARY OF THE INVENTION

The object of this invention is to provide a semiconductor IC free of the problem inherent in the conventional SRAM, that since the SRAM has a great number of memory cells and a large storage capacity, the bipolar transistors of the Bi-CMOS word-lined drive circuit used cannot be as small as the memory cells and cannot be arranged at the rate of ½ piece per cell pitch.

To achieve the object, according to the invention there is provided a semiconductor IC which comprises a substrate, a memory cell array formed on the substrate, a plurality of word-line drive circuits located near the memory cell array. Each of the word-line drive circuit is a Bi-NMOS circuit which comprises a bipolar transistor for pulling up the potential of a word line and an N-channel MOS transistor for pulling down the potential of the word line. The bipolar transistors of the Bi-NMOS circuits have one and the same collector layer.

Since the bipolar transistors shares one collector layer, no element-isolating regions need to be formed, each between the bipolar transistors of any adjacent two word-line drive circuits. For the same reason, it suffices to use only one collector lead for the collectors of the bipolar transistors of any two adjacent word-line drive circuits. Hence, even if the semiconductor IC has a large number of memory cells having a small size, the bipolar transistor of each Bi-NMOS word-line drive circuit can be made as small as the memory cells.

It is therefore possible to arrange the bipolar transistors densely, at the rate of one or ½ piece per cell pitch. This greatly serves to decrease the size of the memory chip very much.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Semiconductor integrated circuits, which are embodiments of the present invention, will be described, with reference to the accompanying drawings. In the drawings, similar and identical components will be designated by the same reference numerals and symbols. In the following description, the similar and identical component will not be repeatedly explained.

Figure 4:
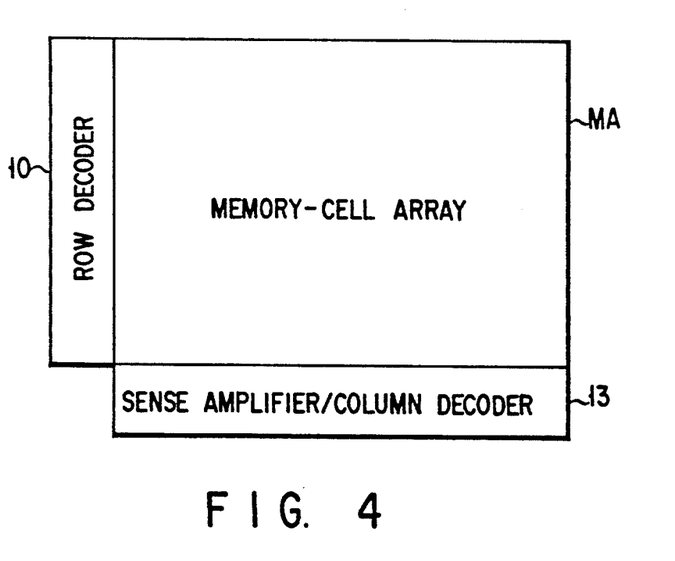
FIG. 4 is a schematic view of a part of a SRAM according to a first embodiment of the present invention.

FIG. 4 shows a part of a SRAM according to the first embodiment of the invention. As is shown in FIG. 4, the SRAM comprises an IC chip, a memory cell array MA formed on the IC chip and memory cells arranged in rows and columns, a row decoder 10 connected to one end of each row of memory cells, and a sense amplifier column decoder 13 connected to one end of column of memory cells.

Figure 5:
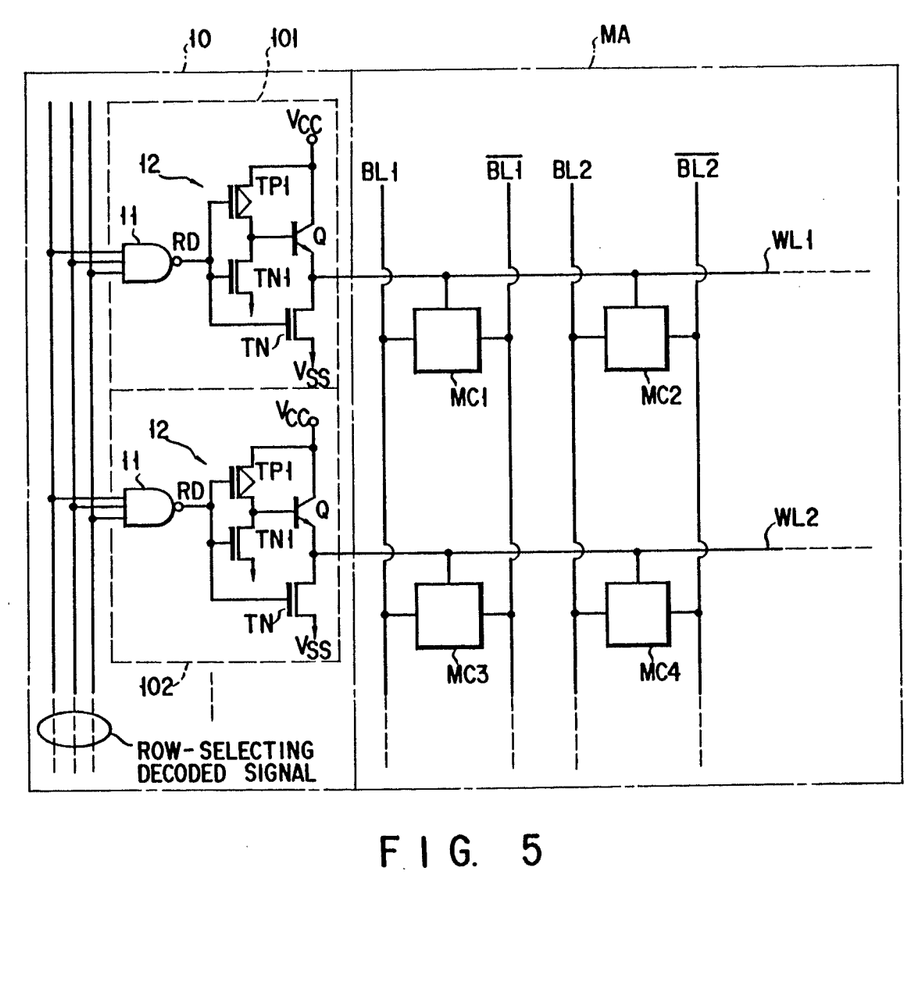
FIG. 5 is a circuit diagram showing the memory cell array of the SRAM shown in FIG. 4, and also a part of the row decoder incorporated in the SRAM.

FIG. 5 shows part of the memory cell array MA and part of the row decoder 10, in detail. The memory cell array MA comprises static memory cells MC1, MC2, MC3, ... which are arranged in m rows and n columns. Of these rows and columns, only two rows and two columns are illustrated in FIG. 5. The memory cell array MA further comprises word lines WL1 and WL2 and bit-line pairs (BL1, $\overline{BL1}$) and (BL2, $\overline{BL2}$).

The row decoder 10 comprises m row decoder units, of which only two 101 and 102 are shown in FIG. 5. The row decoder units 101 and 102 are connected to the word lines WL1 and WL2, respectively. Each of the row decoder units comprises a word-line selecting circuit 11 and a Bi-NMOS word-line drive circuit 12. The circuit 11 is designed to decode a row-selecting address signal into a word-line selecting signal RD. The circuit 12 is connected to one end of the associated word line and designed to generates a word-line drive signal in accordance with the word-line selecting signal RD.

As can be seen from FIG. 5, each Bi-NMOS word-line drive circuit 12 comprises a CMOS inverter, an NPN transistor Q, and an N-channel MOS transistor TN. The CMOS inverter is formed of a P-channel MOS transistor TP1 and an N-channel MOS transistor TN1 and connected to receive the word-line selecting signal RD output by the word-line selecting circuit 11. The NPN transistor Q is used to pull up the potential of the associated word line (i.e., WL1 or WL2); it has its base connected to the output node of the CMOS inverter, its collector coupled to the power-supply potential (Vcc) node, and its emitter connected to the associated word line. The N-channel MOS transistor TN is used to pull down the potential of the associated word line; it is connected between the associated word line and the ground potential (Vss) node and has its gate connected to receive the word-line selecting signal RD.

Figure 6:
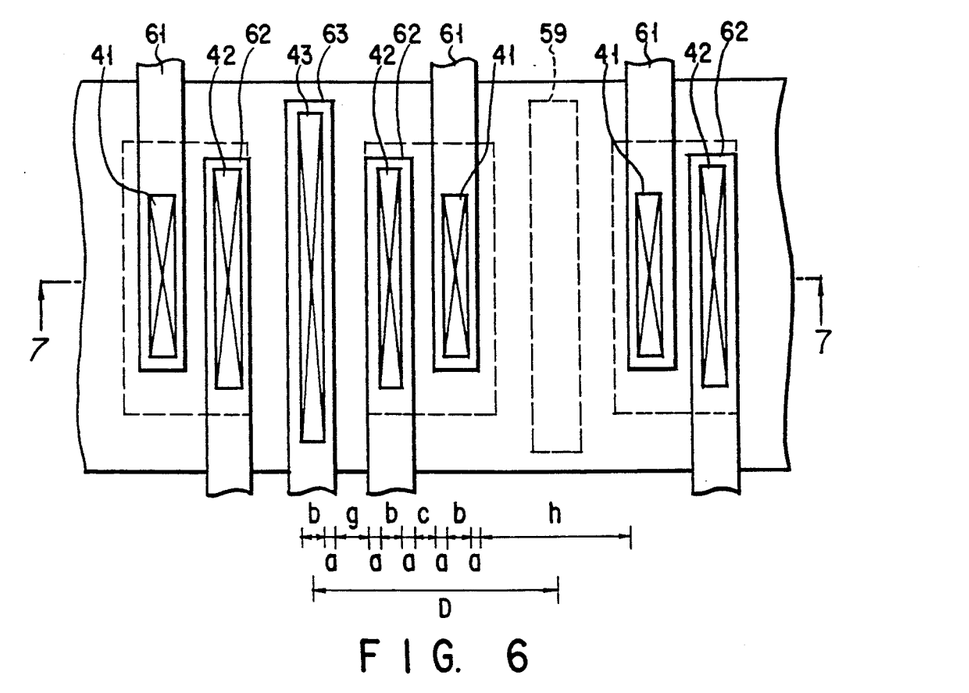
FIG. 6 is a plan view showing one type of a Bi-NMOS word-line drive circuit used in this invention.

FIG. 6 is a plan view showing that part of the memory chip in which the NPN transistors Q of the Bi-NMOS word-line drive circuits 12 are formed. As is shown in this figure, this part of the chip includes the contact portion 41 of an emitter line 61, the contact portion 42 of a base line 62, and the contact portion 43 of a collector line 63.

Figure 7:
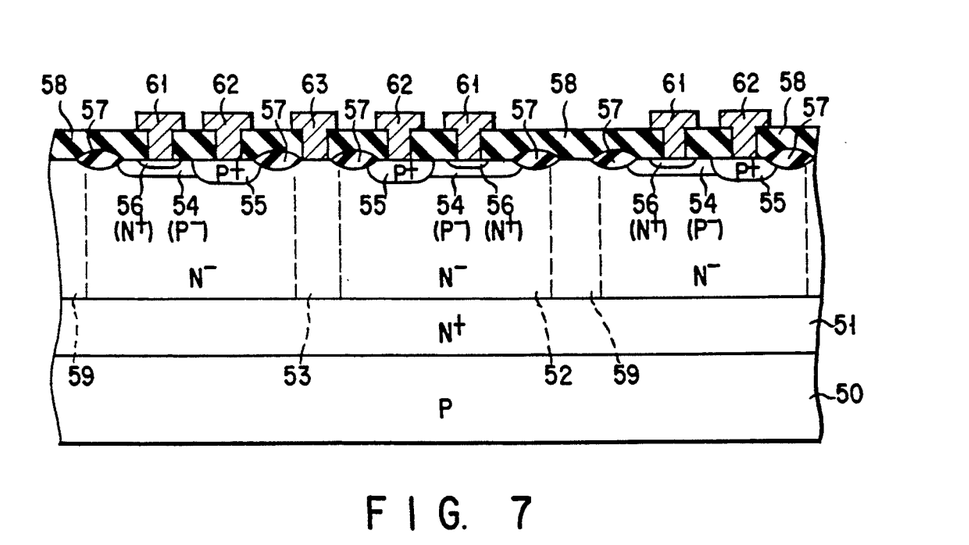
FIG. 7 is a cross-sectional view, taken along line 7—7 in FIG. 6.

FIG. 7 is a cross-sectional view, taken along line 7—7 in FIG. 6. As is evident from FIG. 7, that part of the memory chip which is shown in FIG. 6, comprises a semiconductor substrate 50 of a first conductivity type (e.g., a P-type silicon substrate), a buried layer 51 of the second conductivity type (i.e., an N+collector region), an N— collector region 52 (i.e., an intrinsic collector region) made of an epitaxial layer and formed on the buried layer 51, and a collector lead region 53 formed in a portion of the intrinsic collector region 52 and connected to the buried layer 51. Said part of the memory chip further comprises a P— intrinsic base region 54 (i.e., an inner base region) formed in the surface of a portion of the intrinsic collector region 52, an P+ outer base region 55 formed on the surface of a portion of the intrinsic collector region 52, and an N+ emitter region 56 formed in the surface of a portion of the inner base region 54.

As is shown in FIG. 6, a filed oxide film 57 is formed on a portion of the substrate substrate 50, for isolating semiconductor elements. An inter-layer insulating film 58 is formed on the surface of the entire substrate 50. The insulating film 58 has contact holes. An emitter line 61 made of metal extends through the first contact hole and contacts the emitter region 56 and is connected to the word line WL1 or WL2 of the memory cell array MA. A base line 62 made of metal extends through the second contact hole and contacts the outer base region 55. A collector lead or line 63, also made of metal, extends through the third contact hole and contacts the collector lead region 53.

The collector line 63 is common to the bipolar transistors Q of two adjacent Bi-NMOS word-line drive circuits. As many sets, each comprised of two word-line drive circuits, as the word lines WL1, WL2, ... (i.e., the rows of memory cells of the array MA), as is illustrated in FIG. 5.

The base line 62 and the collector line 63 are formed of the same metal layer as the emitter line 61. They extend from the emitter line 61, in parallel thereto and in the opposite directions to each other. The emitter line 61 may be provided in common for two or more word lines of the memory cell array MA.

In the SRAM shown in FIGS. 4 to 7, the collector regions 52 (i.e., the N— regions) of the bipolar transistors Q incorporated in the Bi-NMOS word-line drive circuits 12 are formed of one and the same layer. Therefore, no isolation regions similar to the regions 87 (FIG. 3) are not formed to isolate the bipolar transistors Q from one another. Further, the collector line 63 is common to the bipolar transistors Q of two adjacent Bi-NMOS word-line drive circuits. Hence, the bipolar transistors Q, which are used to pull up the word-line potentials, can easily made as small as the memory cells MC1, MC2, MC3, ... even if the SRAM has a large storage capacity and the memory cells have a relatively small size. This makes it possible to arrange the bipolar transistors Q densely, at the rate of one or ½ piece per cell pitch, whereby size of the memory chip can be reduced very much.

Since the bipolar transistors Q are arranged as described above, its width D is:

$$D = 5a + 2.5b + c + g + 0.5h$$

where a is the difference between half the width of the metal lines 61, 62, and 63 and half the width of the contact holes of the insulating film 58, b is the width of the contact holes, c is the distance between the metal lines 61 and 62, g is the distance between the outer base region 55 and the collector line 63, and h is the distance between the adjacent emitter regions 56.

If the design rule of 0.5 μm, a=0.2 μm, b=0.5 μm, c=0.5 μm, g=1.0 μm, and h=2.0 μm. Therefore, D=4.75 μm. With a 4-MB SRAM whose memory cells have a length of about 5 μm, it is possible to arrange the bipolar transistors Q densely, at the rate of one piece per cell pitch.

The emitter regions 56 of the bipolar transistors Q incorporated in the adjacent two word-line drive circuits 12 oppose each other in the collector region 52. Therefore, the hot carriers generated immediately beneath the emitter regions 56 may make noise. In order to prevent such noise, a region 59 having an impurity concentration higher than that of the intrinsic collector region 52 is formed by diffusing the impurity into that portion of the collector region 52 which is located between the emitter regions 5 of the bipolar transistors Q. More precisely, the region 59 has an impurity concentration of, for example, $10^{18}$ to $10^{20}$ cm$^{-3}$, where as the impurity concentration of the intrinsic collector region 52 is $10^{16}$ to $10^{17}$ cm$^{-3}$.

The region 59 formed between the emitter regions 56 and having a high impurity concentration serves to reduce greatly the lifetime of the current resulting from the impact ionization occurring in the intrinsic collector region 52 due to the interaction of the collector current and the high-intensity electric field. (The current consists of holes, i.e., the minority carriers generated by the impact ionization.) Its lifetime having been so reduced, the current does reach the emitter region 56 or base region 54 or 55 of the adjacent bipolar transistor Q. The current, i.e., the minority carriers, re-combine with the majority carriers (i.e., electrons).

Hence, even if the emitter regions 56 are located adjacent to each other, with the high impurity concentration region 59 formed between them, no noise is generated from the hot carriers generated immediately beneath the emitter regions 56. Thus, there is no possibility that the bipolar transistors Q of the adjacent two Bi-NMOS word line drive circuits 12 malfunction. It should be noted, however, that the magnitude of the impact ionization depends on the operating conditions of the bipolar transistors.

Figure 8:
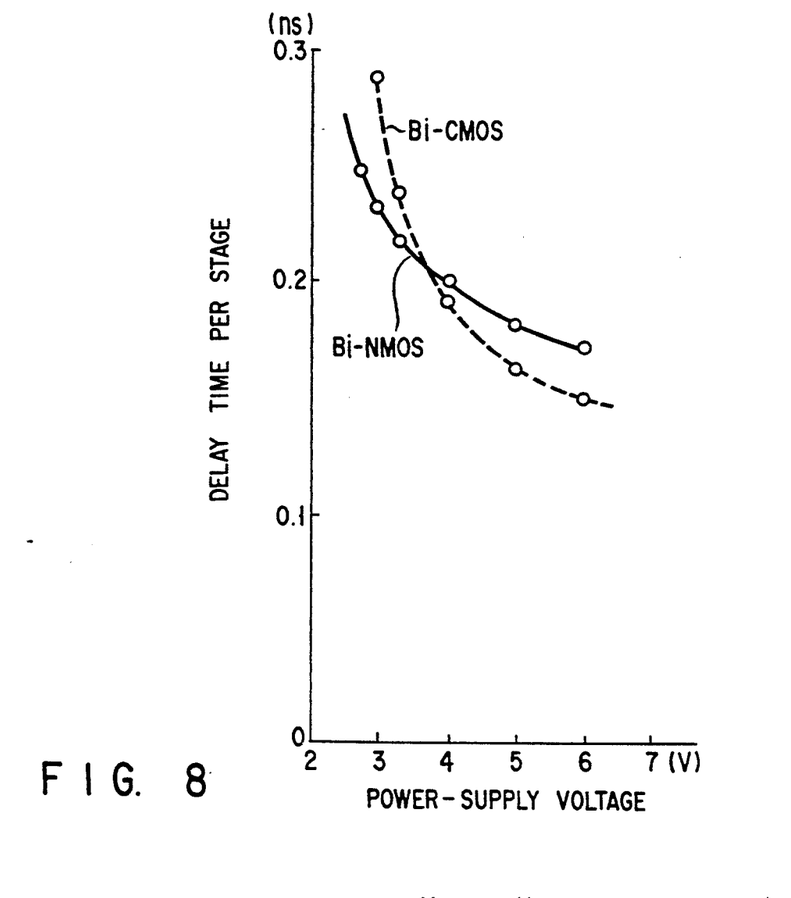
FIG. 8 is a graph representing the power-supply voltage dependency of the one-stage delay time of the Bi-CMOS word-line drive circuit (FIG. 1), and the power-supply voltage dependency of the Bi-NMOS word-line drive circuit (FIG. 6)

FIG. 8 represents the power-supply voltage dependency of the one-stage delay time of the Bi-CMOS word-line drive circuit (FIG. 1), and the power-supply voltage dependency of the Bi-NMOS word-line drive circuit 12.

The smaller the memory cells of a SRAM, the lower the internal power-supply voltage. The value of the internal power-supply voltage generally influences the operating speed of the word-line drive circuits. To be more specific, if the power-supply potential for driving each word-line drive circuit ranges from 2V to 3.7V or is, for example, 3.3V, a Bi-NMOS word-line drive circuit operates faster than a Bi-CMOS word-line drive circuit as is evident from FIG. 8. Hence, the present embodiment of the invention is advantageous over the conventional SRAM having Bi-CMOS word-line drive circuits, provided that the power-supply potential for driving the word-line drive circuits ranges from 2V to 3.7V.

Therefore, the power-supply potential Vcc for operating the Bi-NMOS word-line drive circuits shown in FIG. 5 is set at 2V to 3.7, preferably at 3.3V.

Figure 9:
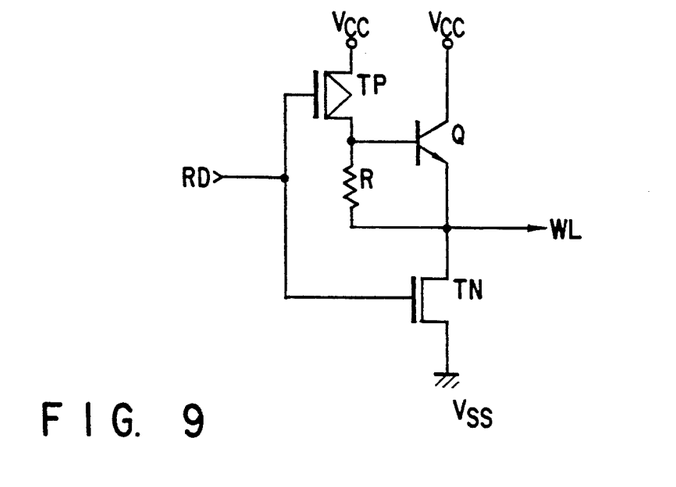
FIG. 9 is a diagram showing another type of a Bi-NMOS word-line drive circuit which can be used in the SRAM of FIG. 5.

FIG. 9 shows another type of a Bi-NMOS word-line drive circuit which can be used in the SRAM of FIG. 5. This Bi-NMOS word-line circuit is identical to the Bi-NMOS word-line drive circuits 12, except in one respect only. Namely, the CMOS inverter is replaced by a P-channel MOS transistor TP and a resistor R. The transistor TP has its gate connected to receive a word-line selecting signal RD and its drain-source path connected between the Vcc node and the base of an NPN Q used for pulling up the word-line potential. The resistor R is connected between the base and emitter of the NPN transistor Q, for discharging the base current of the NPN transistor Q.

Figure 10:
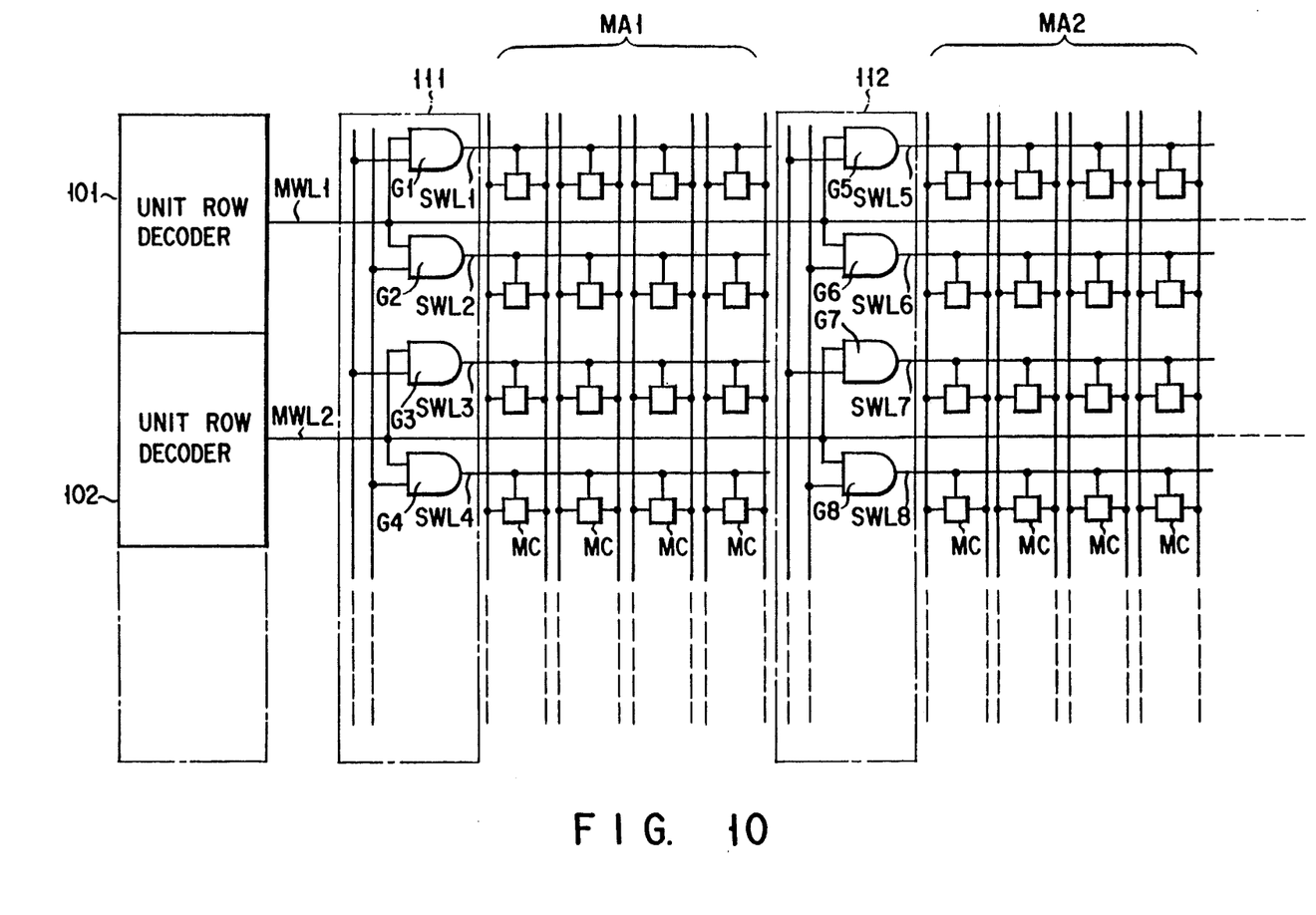
FIG. 10 is a diagram showing another type of a memory cell array which can be used in place of the memory cell array illustrated in FIG. 5.

FIG. 10 shows another type of a memory cell array which can be used in place of the memory cell array MA illustrated in FIG. 5.

The array of FIG. 10 is a double word-line type which comprises a plurality of cell array blocks arranged, side by side in the row direction, and a plurality of row decoders provided in one-to-one association with the array blocks. Of the cell array blocks, only two blocks Ma1 and MA2 are shown in FIG. 10. Similarly, of the row decoders, only two decoders 111 and 112 are shown in FIG. 10, which are associated with the cell array blocks MA1 and MA2, respectively. The memory cell array MA of FIG. 10 further comprises a plurality of unit row decoders and a plurality of main word lines which are coupled to the unit row decoders, respectively. Only two of the unit row decoders, i.e., decoders 101 and 102, and only two of the main word lines, i.e., lines MWL1 and MWL2, are shown in FIG. 10.

The first row decoder 111 comprises four sub-word line selecting gates G1 to G4. The gates G1 and G2 output a logic product of the signal on the main word line MWL1 and a block-selecting signal (a section decoded signal). The gates G3 and G4 output a logic product of the signal on the main word line MWL2 and the block-selecting signal. The outputs of these gates G1 to G4 are connected to sub-word lines SWL1 to SWL4, respectively.

The second row decoder 112 comprises four sub-word line selecting gates G5 to G8. The gates G5 and G6 output a logic product of the signal on the main word line MWL1 and a block-selecting signal (a section decoded signal). The gates G7 and G8 output a logic product of the signal on the main word line MWL2 and the block-selecting signal. The outputs of these gates G5 to G8 are connected to sub-word liens SWL5 to SWL8, respectively.

The main word lines MWL1, MWL2, ... are connected to the bipolar transistors Q of word-line drive (not shown in FIG. 10), which are used to pull up the potentials of the main word lines MWL1, MWL2, ... of the memory cell array MA.

As has been described above, even if the semiconductor conductor IC of the invention has a large storage capacity and, hence, has relatively small memory cells, the bipolar transistors Q incorporated in the word-line drive circuits can easily be made as small as the memory cells. This makes it possible to arrange the bipolar transistors Q densely, at the rate of one or ½ piece per cell pitch. The size of the semiconductor IC can thereby be reduced very much.

The present invention is not limited to the embodiments described above with reference to the accompanying drawings. Rather, various changes and modifications can be made, without departing from the scope and spirit of the present invention which are defined in the following claims.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
a substrate;
a memory cell array formed on said substrate and having a plurality of memory cells arranged in rows and columns, a plurality of word lines and a plurality of bit lines; and
a plurality of word-line drive circuits located near said memory cell array, each being a Bi-NMOS circuit which comprises a bipolar transistor for pulling up the potential of the word line and an N-channel MOS transistor for pulling down the potential of the word line, said bipolar transistors having collector layers which is formed of one and the same layer.

2. The semiconductor integrated circuit according to claim 1, wherein only one collector lead for the collectors of the bipolar transistors of any two adjacent word-line drive circuits are connected to one and the same collector lead which extends at right angles to said word line.

3. The semiconductor integrated circuit according to claim 1, wherein each of said bipolar transistors for pulling up the potential of the word line comprises a semiconductor substrate of a first conductivity type, a collector layer of a second conductivity type opposite to the first conductivity type, buried in said semiconductor substrate, an intrinsic collector region of the second conductivity type formed on said collector layer, a collector lead region formed by diffusing an impurity in a portion of the intrinsic collector region and connected to said collector layer, an inner base region of the first conductivity type formed in the surface of a portion of said intrinsic collector region, an outer base region of the first conductivity type formed in the surface of a portion of said intrinsic collector region, and an emitter region of the second conductivity type formed in the surface of a portion of said inner base region; an emitter line extends from said emitter region in parallel to said word line of said memory cell array; and a collector lead region in parallel to said emitter line in a direction opposite to the direction in which said emitter line extends.

4. The semiconductor integrated circuit according to claim 3, wherein only one collector lead for the collectors of the bipolar transistors of any two adjacent word-line drive circuits are connected to one and the same collector lead which extends at right angles to said word line.

5. The semiconductor integrated circuit according to claim 3, wherein a high impurity concentration region having an impurity concentration higher than that of said intrinsic collector region is formed in that region of said intrinsic collector region which is located between the emitter regions of the bipolar transistors of any two adjacent word-line drive circuits.

6. The semiconductor integrated circuit according to claim 4, wherein a high impurity concentration region having an impurity concentration higher than that of said intrinsic collector region is formed in that region of said intrinsic collector region which is located between the emitter regions of the bipolar transistors of any two adjacent word-line drive circuits.

7. The semiconductor integrated circuit according to claim 5, wherein said intrinsic collector region has an impurity concentration of $10^{16}$ to $10^{17}$ cm$^{-3}$, and said high impurity concentration region has an impurity concentration of $10^{18}$ to $10^{20}$ cm$^{-3}$.

8. The semiconductor integrated circuit according to claim 6, wherein said intrinsic collector region has an impurity concentration of $10^{16}$ to $10^{17}$ cm$^{-3}$, and said high impurity concentration region has an impurity concentration of $10^{18}$ to $10^{20}$ cm$^{-3}$.

9. The semiconductor integrated circuit according to claim 1, wherein an operation power-supply voltage of 2V to 3.7V is applied to said word-line drive circuits.

10. The semiconductor integrated circuit according to claim 1, wherein said memory cell array and said word-line drive circuits are incorporated in a SRAM integrated circuit.

11. The semiconductor integrated circuit according to claim 10, wherein said bipolar transistors for pulling up the potentials of the word line have emitter electrodes which are connected to the word lines of the memory cell arrays incorporated in said SRAM integrated circuit.

12. The semiconductor integrated circuit according to claim 10, wherein said SRAM integrated circuit is of double word line type which has a memory cell array having main word lines, and said bipolar transistors for pulling up the potentials of the word line have emitter electrodes which are connected to the main word lines of the memory cell arrays of said SRAM integrated circuit.

* * * * *

UNITED STATES PATENT AND TRADEMARK OFFICE
CERTIFICATE OF CORRECTION

PATENT NO. : 5,243,557
DATED : September 07, 1993
INVENTOR(S) : Takeo Maeda et al.

It is certified that error appears in the above-indentified patent and that said Letters Patent is hereby corrected as shown below:

Claim 1, column 8, line 19, change "is" to --are--.

Claim 7, column 9, line 3, change "$cm^{31\ 3}$" to --$cm^{-3}$,--.

Claim 8, column 9, change "$cm^{31\ 3}$," to --$cm^{-3}$,--.

Signed and Sealed this

Twenty-seventh Day of September, 1994

Attest:

BRUCE LEHMAN

*Attesting Officer*  *Commissioner of Patents and Trademarks*